(12) United States Patent
Rozsypal

(10) Patent No.: US 6,934,520 B2
(45) Date of Patent: Aug. 23, 2005

(54) CMOS CURRENT MODE RF DETECTOR AND METHOD

(75) Inventor: Antonin Rozsypal, Roznov (CZ)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 477 days.

(21) Appl. No.: 10/078,516

(22) Filed: Feb. 21, 2002

(65) Prior Publication Data

US 2003/0157913 A1 Aug. 21, 2003

(51) Int. Cl.[7] ............................. H04B 1/04; H03F 3/04
(52) U.S. Cl. ...................... 455/127.3; 455/127.1; 455/245.1; 330/296; 330/277; 330/130
(58) Field of Search ................ 455/232.1, 234.1, 455/234.2, 245.1, 245.2, 127.1, 127.2, 126, 127.3; 330/288, 285, 130, 133, 134, 135, 138, 277–279, 296, 221

(56) References Cited

U.S. PATENT DOCUMENTS

| | | | | |
|---|---|---|---|---|
| 4,816,772 A | * | 3/1989 | Klotz | ............................ 330/254 |
| 5,079,454 A | * | 1/1992 | Benton et al. | ............... 327/65 |
| 5,214,393 A | * | 5/1993 | Aihara | ......................... 330/279 |
| 5,329,244 A | * | 7/1994 | Fujita et al. | ................. 330/149 |
| 5,603,113 A | * | 2/1997 | De Loe, Jr. | ............... 455/234.1 |
| 5,724,003 A | * | 3/1998 | Jensen et al. | ............... 330/129 |
| 6,212,479 B1 | * | 4/2001 | Shoulders et al. | ........... 702/104 |
| 6,259,682 B1 | * | 7/2001 | Brown et al. | ................ 370/311 |
| 6,265,039 B1 | * | 7/2001 | Drinkwater et al. | ........ 428/36.1 |
| 6,710,716 B1 | * | 3/2004 | Abe et al. | .................... 340/635 |

* cited by examiner

*Primary Examiner*—Edward F. Urban
*Assistant Examiner*—Blane J. Jackson
(74) *Attorney, Agent, or Firm*—James J. Stipanuk; Robert F. Hightower

(57) ABSTRACT

An integrated detector circuit (20) includes first and second gain stages ($GS_1$, $GS_2$). The first gain stage has an input (82) that monitors a high frequency signal ($V_{RFDET}$) for routing a first detection current ($IS_1$) to a node (60). The second gain stage includes a first current source ($PF_1$) that supplies a bias current ($I_{MAX1}$) indicative of a predefined amplitude of the high frequency signal. An input of the second gain stage monitors the high frequency signal to route a portion of the bias current to the node as a second detection current ($IS_2$), which is limited to the bias current when the high frequency signal is greater than the predefined amplitude to compensate for a nonlinearity in a transconductance of the second gain stage.

20 Claims, 2 Drawing Sheets

CMOS CURRENT MODE RF DETECTOR AND METHOD

BACKGROUND OF THE INVENTION

The present invention relates in general to semiconductor devices and, more particularly, to high frequency detector circuits.

In most if not all countries, the transmission of high frequency signals is controlled by industry standards and/or by government regulation. For example, transmitted signals in cellular telephones and other wireless communication devices are limited to operating in predefined frequency bands ranging from about four hundred megahertz to about 2.5 gigahertz. The amplitudes of the transmitted signals also are limited to avoid interference with other devices operating in the same or adjacent frequency bands. In addition, manufacturers extend the battery life of the wireless devices by reducing the transmitted power when such a reduction is possible without interrupting communications.

In order to control the transmitted power, a high frequency signal typically is monitored with a radio frequency (RF) detector that senses the signal's amplitude and produces a corresponding detection signal. A control circuit uses the detection signal and other communications information to control a power amplifier that produces the transmitted signal at an appropriate amplitude.

Previous systems use discrete devices such as Schottky diodes for the RF detectors. However, the discrete devices require additional circuitry to generate a useful detection signal, which increases the system's parts count as well as its size and manufacturing cost. Other systems integrate the Schottky diodes with the control circuitry to form a single integrated circuit. However, this scheme increases the complexity of the fabrication process, which increases the fabrication cost of the integrated circuit and can reduce the die yield, further increasing the cost.

Hence, there is a need for an integrated RF detector circuit and detection method that reduces the physical size and manufacturing cost of a wireless communications system.

DETAILED DESCRIPTION OF THE DRAWINGS

In the figures, elements having the same reference number have similar functionality.

Figure 1:
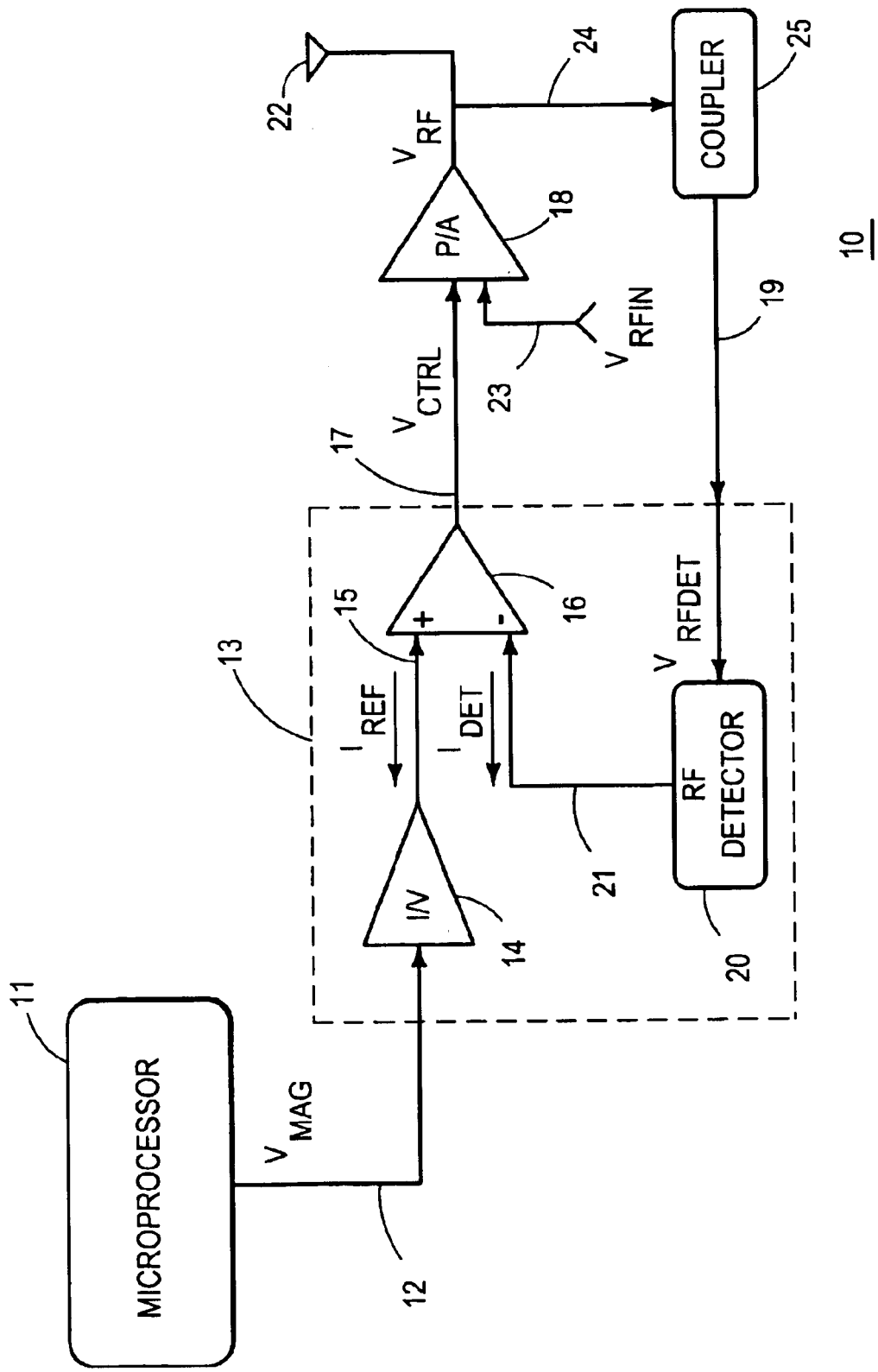
FIG. 1 is a block diagram of a power stage of a wireless communications device.

FIG. 1 is a block diagram of a power stage 10 of a wireless communications device such as a cellular telephone, including a microprocessor 11, a control circuit 13, a power amplifier 18 and a coupler 25. Power stage 10 generates a high frequency signal $V_{RF}$ with a carrier frequency component operating at a radio frequency (RF) of about nine hundred megahertz. Other embodiments operate with a high frequency signal $V_{RF}$ that ranges between about four hundred megahertz and about 2.5 gigahertz.

Microprocessor 11 is a digital processing circuit that includes a digital to analog converter for converting internal digital data to an analog amplitude control signal $V_{MAG}$ to set the magnitude of high frequency signal $V_{RF}$.

Power amplifier 18 has a signal input 23 that receives an RF signal $V_{RFIN}$ at a carrier frequency of about nine hundred megahertz that is modulated with analog and/or digital information. Power amplifier 18 amplifies $V_{RFIN}$ to produce high frequency signal $V_{RF}$ at a node 24 with a power level that can range over about five decades, or an equivalent voltage range from about twenty millivolts to about four volts. An analog amplitude control signal $V_{CTRL}$ is produced at a node 17 by control circuit 13 to control the gain of power amplifier 18 and therefore the amplitude of high frequency signal $V_{RF}$.

Coupler 25 is an attenuator that transfers high frequency signal $V_{RF}$ to a transmission line on a node 19 to produce a high frequency signal $V_{RFDET}$ at a reduced amplitude. In one embodiment, coupler 25 attenuates $V_{RF}$ by a factor of ten in order to avoid driving control circuit 13 into an overload condition when $V_{RF}$ has a high amplitude level.

Control circuit 13 includes a transconductance amplifier 14, a differential transimpedance amplifier 16 and an RF detector 20. Control circuit 13 is formed on a semiconductor die as an integrated circuit fabricated with a standard complementary metal-oxide-semiconductor (CMOS) process using 0.6 micrometer lithography.

Transconductance amplifier 14 amplifies and converts amplitude control signal $V_{MAG}$ to a proportional current $I_{REF}$ that is provided on a node 15 to function as a reference current.

RF detector 20 has a sense input on node 19 for detecting or sensing the amplitude of high frequency signal $V_{RFDET}$ to produce a direct current (DC) detection current $I_{DET}$ at an output coupled to a node 21.

Differential transimpedance amplifier 16 amplifies $I_{DET}$ using current $I_{REF}$ as a reference and produces $V_{CTRL}$ at node 17.

RF detector 20 is formed with nonlinear elements which are needed to produce DC components of detection current $I_{DET}$ to provide the detection function. RF detector 20 compensates for the nonlinear elements to produce detection current $I_{DET}$ as a substantially linear function of the amplitude of $V_{RFDET}$ as described in detail below.

Figure 2:
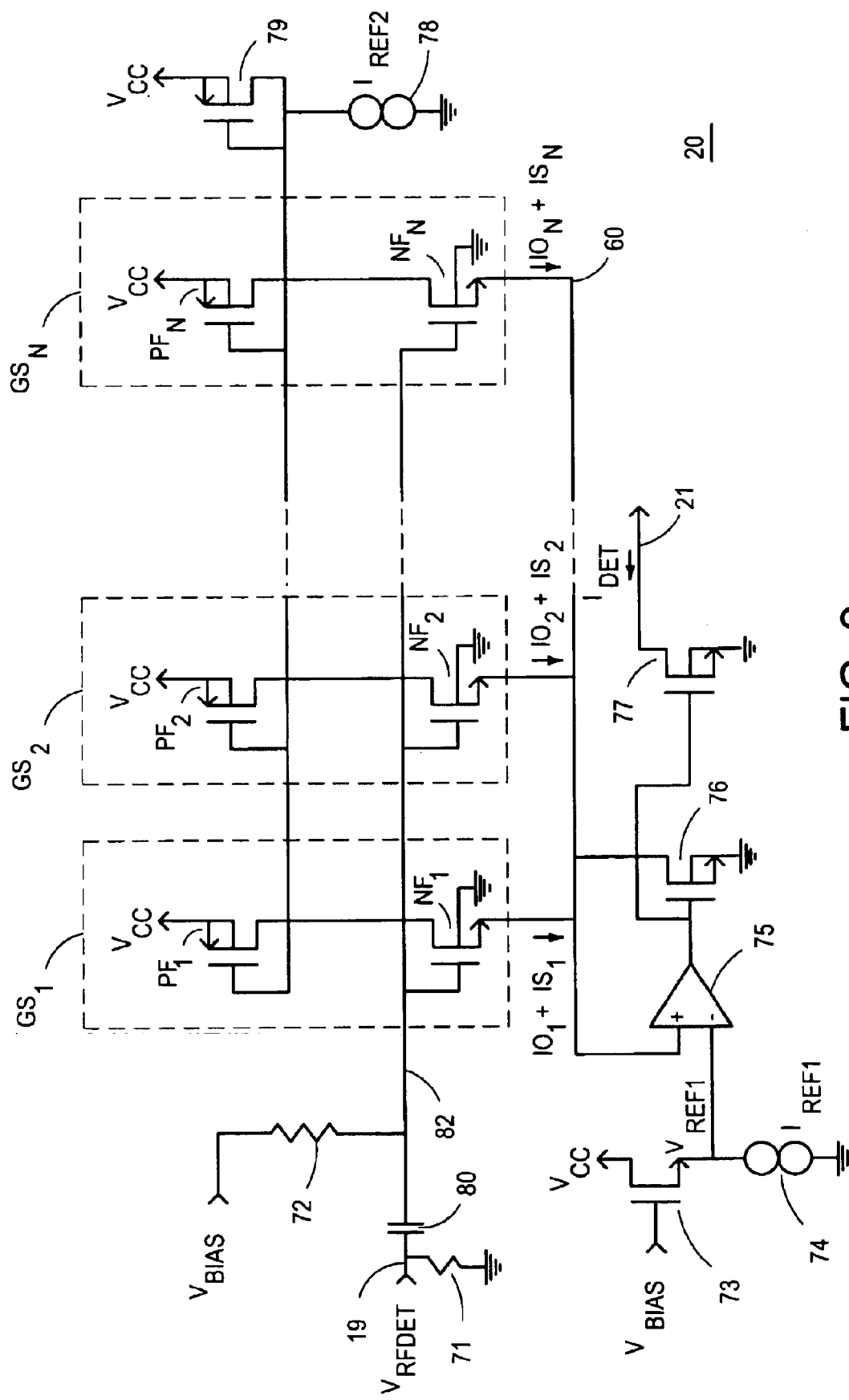
FIG. 2 is a schematic diagram of a radio frequency signal detection circuit.

FIG. 2 is a schematic diagram showing RF detector 20 in further detail, including a series of parallel-connected transconductance gain stages $GS_1$, $GS_2$ ... $GS_N$, where N is an integer. In one embodiment, N=5. To prevent standing waves on node 19, a termination resistor 71 is used to match the characteristic impedance of the transmission line designated as node 19. In one embodiment, resistor 71 has a value of about fifty ohms. $V_{RFDET}$ is coupled through a coupling capacitor 80 to a node 82. In one embodiment, coupling capacitor 80 has a value of about ten picofarads. A DC bias voltage $V_{BIAS}$ is coupled through a resistor 72 to provide a DC bias on node 82. Resistor 72 typically has a value at least ten times that of resistor 71 to avoid loading node 19 and attenuating high frequency signal $V_{RFDET}$.

Gain stage $GS_1$ includes a p-channel metal-oxide-semiconductor field effect transistor (MOSFET) $PF_1$ and an n-channel MOSFET $NF_1$ configured as shown. The other gain stages are similarly configured so, for example, gain stage $GS_2$ includes a p-channel MOSFET $PF_2$ and an n-channel MOSFET $NF_2$, gain stage $GS_N$ includes a p-channel MOSFET $PF_N$ and an n-channel MOSFET $NF_N$, and so forth.

A diode coupled p-channel transistor 79 receives a reference current $I_{REF2}$ from a current source 78 to provide a gate bias potential that establishes maximum currents $I_{MAX1}$ through $I_{MAXN}$ that can flow through MOSFETs $PF_1$–$PF_N$, respectively. Transistor 79 is scaled or matched with MOSFETS $PF_1$–$PF_N$, so maximum currents $I_{MAX1}$ through $I_{MAXN}$ are multiples of $I_{REF2}$.

MOSFETs $NF_1$–$NF_N$ respectively have first conduction electrodes or sources coupled to a common node 60 and control electrodes or gates coupled to node 82 to receive bias voltage $V_{BIAS}$. The effective sizes or widths $W_1$–$W_N$ of MOSFETs $NF_1$–$NF_N$ are scaled in predefined ratios and since $NF_1$–$NF_N$ have the same gate to source potential, quiescent currents $I0_1$–$I0_N$ flow through MOSFETs $NF_1$–$NF_N$ to common node 60 in the same ratios.

Common node 60 is maintained at a substantially constant potential by a regulation circuit that includes transistors 73 and 76, a current source 74 and an amplifier 75. Transistor 73 is scaled to MOSFETs $NF_1$–$NF_N$ and also has its gate receiving bias voltage $V_{BIAS}$. Current source 74 supplies a reference current $I_{REF1}$ that is scaled to reference current $I_{REF2}$ to establish a reference potential $V_{REF1}$ at an inverting input of amplifier 75. A feedback path from the gate of transistor 76 to common node 60 and the non-inverting input of amplifier 75 maintains the potential of common node 60 substantially constant. As a result, quiescent currents $I0_1$–$I0_N$ have controllable values which are scaled to reference current $I_{REF1}$.

In addition to quiescent currents $I0_1$–$I0_N$, MOSFETs $NF_1$–$NF_N$ produce detection currents $IS_1$–$IS_N$, respectively, in response to high frequency signal $V_{RFDET}$. Quiescent currents $I0_1$–$I0_N$ and detection currents $IS_1$–$IS_N$ are summed on node 60, routed through a transistor 76 and mirrored in a transistor 77 to produce detection current $I_{DET}$ at node 21 as an output current of RF detector 20.

Recall that MOSFETs $PF_1$–$PF_N$ are scaled or ratioed to provide limiting or maximum currents that can flow in gain stages $GS_1$–$GS_N$. MOSFETS $NF_1$–$NF_N$ are also scaled or ratioed to produce quiescent currents $I0_1$–$I0_N$ that establish the operating points of gain stages $GS_1$–$GS_N$. The effect of this scaling is to define amplitude breakpoints of high frequency signal $V_{RFDET}$ at which detection currents $IS_1$–$IS_N$ reach their respective maximum current levels $I_{MAX1}$–$I_{MAXN}$. Table I below shows the effective width $W_X$ of MOSFET $NF_X$, quiescent currents $I0_X$ through gain stage $GS_X$, the effective width $WP_X$ of MOSFET $PF_X$, maximum current $I_{MAXX}$ and the voltage amplitude of high frequency signal $V_{RFDET}$ at which $(I0_X + IS_X) = I_{MAXX}$ for values of X from 1–N in a standard 0.6 micrometer CMOS embodiment in which N=5.

TABLE I

| Gain Stage | $W_X$ (um) | $I_{MAXX}$ (A) | $I0_X$ | $V_{RFDET}$ when $I_{MAXX} = I0_X + IS_X$ | $WP_X$ |
|---|---|---|---|---|---|
| $GS_1$ | 350 um | 35 uA | 30 uA | 40 mV | 37 um |
| $GS_2$ | 78 um | 11.5 uA | 6.7 uA | 110 mV | 11.5 um |
| $GS_3$ | 45 um | 19 uA | 3.85 uA | 320 mV | 19 um |
| $GS_4$ | 17 um | 43 uA | 1.45 uA | 890 mV | 43 um |
| $GS_5$ | 7 um | 120 uA | 0.6 uA | 2500 mV | 120 u |

The operation of gain stage $GS_1$ proceeds as follows. MOSFET $NF_1$ routes a portion of bias current $I_{MAX1}$ to common node 60 as detection current $IS_1$ in response to high frequency signal $V_{RFDET}$. When $V_{RFDET}$ reaches an amplitude of about forty millivolts, $IS_1=(I_{MAX1}-I0_1)$ and does not increase with further increases in $V_{RFDET}$. Gain stages $GS_2$–$GS_5$ have similar operation, but their detection currents reach maximum values at different breakpoints as shown in Table I.

The transfer functions of gain stages $GS_1$–$GS_N$ are nonlinear over the full amplitude range of $V_{RFDET}$ from zero to about four volts, which is necessary for producing detection currents $IS_1$–$IS_N$ with DC current components. For example, gain stage $GS_1$ produced $IS_1$ as a function of $V_{RFDET}$ in accordance with a transconductance $gm_1$ given by $gm_1 = (IS_1/V_{RFDET}) = k*W_1*V_{RFDET}$, approximately, where K is a constant and $W_1$ is the effective width of MOSFET $NF_1$. Note that transconductance $gm_1$ is proportional to $W_1$, which is a constant, and to $V_{RFDET}$, which is a variable. Since $gm_1$ increases with the amplitude of $V_{RFDET}$, $IS_1$ is a nonlinear function of $V_{RFDET}$. Gain stages $GS_2$–$GS_N$ have similar transfer functions.

The detailed operation of RF detector 20 is described as follows when N=5. When the amplitude of $V_{RFDET}$ is less than about forty millivolts, the overall transfer function of RF detector 20 is $I_{DET}=k*(W_1+W_2+W_3+W_4+W_5)*V_{RFDET}^2$, approximately, where $W_1$–$W_5$ are the respective widths of MOSFETs $NF_1$ through $NF_5$. When high frequency signal $V_{RFDET}$ reaches an amplitude of about forty millivolts, detection current $IS_1$ reaches its maximum value of $(I_{MAX1}-I0_1)$, and further increases in amplitude do not result in further increases in $IS_1$. Hence, in a range above about forty millivolts, gain stage $GS_1$ makes no further contribution to $I_{DET}$. From forty to about one hundred ten millivolts, only gain stages $GS_2$–$GS_5$ contribute to the total transconductance of RF detector 20, so $I_{DET}=k*(W_2+W_3+W_4+W_5)*V_{RFDET}^2$, approximately. In a similar fashion, as other $V_{RFDET}$ breakpoints listed in Table I are reached, successive detection currents $IS_2$–$IS_4$ reach their maximum levels $(I_{MAX2}-I0_2), \ldots, (I_{MAX4}-I0_4)$ to reduce the effective overall transconductance of RF detector 20 in successive steps until $V_{RFDET}$ reaches eight hundred ninety millivolts. At higher $V_{RFDET}$ amplitudes, only gain stage $GS_5$ contributes to further increases in $I_{DET}$. In effect, as the nonlinearity of each stage's transconductance increases, RF detector 20 compensates by successively reducing the number of stages that actively contribute to the overall transconductance. The result is a linear transfer function in which $I_{DET}$ is proportional to $V_{RFDET}$. It is evident that the number of gain stages and/or the breakpoint amplitudes may vary depending on the linearity desired in the overall transfer function, the degree of nonlinearity of each gain stage and other factors.

Hence, the present invention provides an integrated circuit operating as an RF detector that has a first gain stage whose input monitors a high frequency signal and routes a first detection current to a node. A second gain stage includes a first current source that supplies a bias current indicative of a predefined amplitude of the high frequency signal. An input of the second gain stage monitors the high frequency signal to route a portion of the bias current to the node as a second detection current. The second detection current is limited to the bias current when the high frequency signal is greater than the predefined amplitude to compensate for a nonlinearity in a transconductance of the second gain stage. Hence, above the predefined amplitude of the high frequency signal, the detector circuit's overall transconductance is modified to compensate for the nonlinearity. Other gain stages operate in a similar fashion to successively apply different transconductances to different amplitude ranges of the high frequency signal, allowing the detector circuit to compensate for nonlinearities in the transconductances of the other gain stages. The result is a substantially linear transfer function in which the overall detection current is proportional to the high frequency signal. Moreover, the detection function is provided on an integrated circuit using standard CMOS processing and without requiring external Schottky diodes or similar devices.

What is claimed is:

1. An integrated detector circuit, comprising:
   a first gain stage having an input that monitors a high frequency signal for routing a first detection current to a node and having a first current source coupled to form a first bias current having a first maximum value wherein a maximum value of the first detection current is limited to the first maximum value; and
   a second gain stage including a second current source for supplying a second bias current having a second maximum value indicative of a predefined amplitude of the high frequency signal, and having an input for monitoring the high frequency signal to route a portion of the second bias current to the node as a second detection current, wherein the second detection current is limited to the second maximum value when the high frequency signal is greater than the predefined amplitude, and wherein the second maximum value is greater than the first maximum value.

2. An integrated detector circuit, comprising:
   a first gain stage having an input that monitors a high frequency signal for routing a first detection current to a node; and
   a second gain stage including a first current source for supplying a bias current indicative of a predefined amplitude of the high frequency signal, and having an input for monitoring the high frequency signal to route a portion of the bias current to the node as a second detection current, wherein the second detection current is limited to the bias current when the high frequency signal is greater than the predefined amplitude wherein the second gain stage includes a first transistor having a control electrode coupled for receiving the high frequency signal and a first conduction electrode coupled to the node for supplying the second detection current.

3. The integrated detector circuit of claim 2, wherein the current source includes a second transistor having a conduction electrode coupled to a second conduction electrode of the first transistor.

4. The integrated detector circuit of claim 3, wherein the first transistor is an n-channel metal oxide semiconductor field effect transistor (MOSFET) having a gate that functions as the control electrode and the second transistor is a p-channel MOSFET having a drain that functions as the conduction electrode.

5. The integrated detector circuit of claim 2, further comprising a third gain stage having an input that monitors the high frequency signal for routing a third detection current to the node.

6. The integrated detector circuit of claim 5, wherein the first gain stage includes:
   a second current source for supplying a second bias current; and
   a second transistor having a control electrode coupled for receiving the high frequency signal and a first conduction electrode for routing a portion of the second bias current to the node as the second detection current.

7. The integrated detector circuit of claim 6, wherein the first and second transistors are scaled to a ratio and the first and second detection currents are scaled to the ratio when the high frequency signal is zero.

8. The integrated detector circuit of claim 2, further comprising an amplifier having a first input coupled to receive a reference signal, a second input coupled to the node, and an output for maintaining the node at a predetermined potential.

9. The integrated detector circuit of claim 2, wherein the high frequency signal operates at a frequency greater than four hundred megahertz.

10. A detector circuit, comprising gain stages wherein each gain stage includes a current source for establishing maximum current levels in the gain stages at corresponding amplitudes of a high frequency signal and wherein each gain stage has a different maximum current level, wherein the gain stages function with transfer functions that convert the high frequency signal to detection currents for summing at a common node to produce an output detection signal as a substantially linear function of the high frequency signal, wherein the detection currents reach the maximum current levels at the corresponding amplitudes to compensate for nonlinearities in the transfer functions.

11. A detector circuit, comprising gain stages that include current sources for establishing maximum current levels in the gain stages at corresponding amplitudes of a high frequency signal, wherein the gain stages function with transfer functions that convert the high frequency signal to detection currents for summing at a common node to produce an output detection signal as a substantially linear function of the high frequency signal, wherein the detection currents reach the maximum current levels at the corresponding amplitudes to compensate for nonlinearities in the transfer functions and wherein the gain stages include transistors whose control electrodes are coupled to an input of the detector circuit and whose sources are coupled to the common node for providing the detection currents.

12. The detector circuit of claim 11, further comprising:
   an amplifier having a first input for receiving a reference voltage and a second input coupled to the common node; and
   a first transistor having a control electrode coupled to an output of the amplifier and a conduction electrode coupled to tho common node.

13. A method of detecting a high frequency signal, comprising the steps of:
   amplifying a high frequency signal with a first transconductance to produce a first detection current;
   amplifying the high frequency signal with a second transconductance to produce a second detection current for summing with the first detection current to produce an output signal; and
   limiting the first detection current to a constant value to compensate for a nonlinearity in the second transconductance when the high frequency signal is greater than a predefined amplitude.

14. The method of claim 13, wherein the step of limiting includes the steps of:
   generating a bias current with a current source; and
   routing a portion of the bias current through a transistor with the high frequency signal to produce the first detection current.

15. The method of claim 13, further comprising the step of summing the first and second detection currents at a node to produce an output signal.

16. The method of claim 15, further comprising the steps of:
   developing a reference voltage with a reference current; and
   amplifying a difference between the reference voltage and a potential at the node to produce a correction signal that maintains the potential at the node substantially constant.

17. The method of claim 13, wherein the step of amplifying a high frequency signal with a first transconductance includes the step of converting a signal operating at a frequency greater than about four hundred megahertz to the first detection current.

18. A detector circuit, comprising:

a current source for providing a bias current;

a first transistor operating in response to a high frequency signal and having a first width and a first conduction electrode coupled to a node for producing a portion of the bias current as a first detection current; and a second transistor operating in response to the high frequency signal, having a second width less than the first width, and having a first conduction electrode coupled to the node for producing a second detection current for summing with the first detection current to produce an output signal.

19. The detector circuit of claim 18, wherein the first detection current has a value substantially equal to the bias current when the high frequency signal is greater than a predefined amplitude to compensate for a nonlinearity in a transfer function of the second transistor.

20. The detector circuit of claim 19, further comprising a third transistor having a conduction electrode coupled to a second conduction electrode of the first transistor to supply the bias current.

* * * * *